(12) United States Patent
Misumi et al.

(10) Patent No.: US 8,163,836 B2
(45) Date of Patent: Apr. 24, 2012

(54) ADHESIVE COMPOSITION AND ADHESIVE FILM

(75) Inventors: Koichi Misumi, Kawasaki (JP); Ken Miyagi, Kawasaki (JP); Atsushi Miyanari, Kawasaki (JP); Yoshihiro Inao, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 36 days.

(21) Appl. No.: 12/090,343

(22) PCT Filed: Oct. 23, 2006

(86) PCT No.: PCT/JP2006/321080
§ 371 (c)(1),
(2), (4) Date: Apr. 15, 2008

(87) PCT Pub. No.: WO2007/049566
PCT Pub. Date: Mar. 5, 2007

(65) Prior Publication Data
US 2009/0137760 A1 May 28, 2009

(30) Foreign Application Priority Data
Oct. 28, 2005 (JP) ................................. 2005-315282

(51) Int. Cl.
*C08L 33/06* (2006.01)

(52) U.S. Cl. ............ 524/560; 428/355 AC; 428/355 RA; 428/522; 524/553; 524/561; 526/319; 526/329.2

(58) Field of Classification Search ............ 428/355 RA, 428/522, 355 AC; 438/113, 460, 464; 524/553, 524/560, 561; 526/280, 281, 283, 319, 329.2
See application file for complete search history.

(56) References Cited

U.S. PATENT DOCUMENTS

| | | | | |
|---|---|---|---|---|
| 3,867,481 A * | 2/1975 | Whang | ......................... | 525/229 |
| 4,912,169 A * | 3/1990 | Whitmire et al. | ............. | 525/221 |
| 5,049,085 A * | 9/1991 | Reylek et al. | ................... | 439/91 |
| 5,798,426 A * | 8/1998 | Anton et al. | ............. | 526/318.41 |
| 5,993,961 A * | 11/1999 | Ugolick et al. | ................ | 428/354 |
| 6,686,413 B2 * | 2/2004 | Nakamura et al. | ............ | 524/553 |
| 7,019,075 B2 * | 3/2006 | Righettini et al. | .............. | 525/64 |
| 7,163,597 B2 * | 1/2007 | Murata et al. | ................ | 156/248 |
| 7,262,242 B2 * | 8/2007 | Gielens et al. | ................ | 524/523 |
| 2002/0091197 A1 | 7/2002 | Nakamura et al. | | |
| 2004/0059058 A1 * | 3/2004 | Righettini et al. | .............. | 525/98 |
| 2004/0229990 A1 * | 11/2004 | Righettini et al. | ............ | 524/445 |
| 2005/0136251 A1 | 6/2005 | Kishimoto et al. | | |
| 2005/0153129 A1 | 7/2005 | Yoshida et al. | | |
| 2005/0196608 A1 * | 9/2005 | Wouters et al. | ........... | 428/355 R |
| 2006/0036040 A1 * | 2/2006 | Takeko et al. | ................. | 525/192 |
| 2008/0131640 A1 * | 6/2008 | Kawamura et al. | .......... | 428/41.8 |

FOREIGN PATENT DOCUMENTS

| | | |
|---|---|---|
| CN | 1036393 | 10/1989 |
| DE | 602004001796 T2 | 11/2006 |
| DE | 60313396 T2 | 1/2008 |
| EP | 0312228 | 4/1989 |
| EP | 1464688 B1 | 8/2006 |
| EP | 1371702 B1 | 4/2007 |
| JP | S61-158145 | 7/1986 |
| JP | H11-148045 | 6/1999 |
| JP | 2001-077304 | 3/2001 |
| JP | 2001-279208 | 10/2001 |
| JP | 2002-203821 | 7/2002 |
| JP | 2002-206042 A | 7/2002 |
| JP | 2002-256226 | 9/2002 |
| JP | 2003-173993 | 6/2003 |
| JP | 2003-292931 | 10/2003 |
| JP | 2005-505943 A | 2/2005 |
| JP | 2005-165302 | 6/2005 |
| JP | 3688702 B2 | 6/2005 |
| JP | 2005-191550 | 7/2005 |
| WO | WO 03/033208 | 4/2003 |

OTHER PUBLICATIONS

Office Action issued in corresponding German Patent Application No. 112006003042.6, mailed Dec. 8, 2009.
Notice of Reasons for Rejection issued in corresponding Taiwanese Patent Application No. 095139566, mailed Feb. 23, 2010.

* cited by examiner

*Primary Examiner* — David W Wu
*Assistant Examiner* — Marie Reddick
(74) *Attorney, Agent, or Firm* — Knobbe Martens Olson & Bear LLP

(57) ABSTRACT

An adhesive composition which is reduced in gas generation upon heating (has low hygroscopicity), has high alkali resistance, has heat resistance of 200° C. or higher, and can be easily removed with a stripping liquid; and an adhesive film made with the adhesive composition. The adhesive composition is prepared using, at least as a major ingredient, an acrylic polymer produced from (a) styrene, (b) a (meth)acrylic ester monomer containing a cyclic skeleton, and (c) an alkyl (meth) acrylate monomer. The adhesive film has an adhesive composition layer formed from this adhesive composition.

7 Claims, 1 Drawing Sheet

ADHESIVE COMPOSITION AND ADHESIVE FILM

RELATED APPLICATIONS

This application is the U.S. National Phase filing under 35 U.S.C. §371 of PCT/JP2006/321080, filed Oct. 23, 2006, which designated the United States and was published in a language other than English, which claims priority under 35 U.S.C. §119 (a)-(d) to Japanese Patent Application No. 2005-315282, filed Oct. 28, 2005. The content of these applications is incorporated herein by reference in their entireties.

TECHNICAL FIELD

The present invention relates to an adhesive composition, and particularly relates to an adhesive composition for temporarily fixing a sheet or a protective substrate on a product in order to hold and protect the product in steps of high-precision processing, for example, in grinding optical products and semiconductor products such as semiconductor wafers, and an adhesive film.

BACKGROUND ART

Conventionally, tacky adhesion sheets have been used for surface protection and damage prevention of the products when optical parts such as lenses, and semiconductor products such as semiconductor wafers are subjected to high-precision processing in optical industry, semiconductor industry, and the like. For example, in production steps of semiconductor chips, the semiconductor chip is produced by: slicing highly purified silicon single crystals or the like to give a wafer; incorporating an integrated circuit by etching of a certain circuit pattern such as IC on the wafer surface; grinding the back face of the resulting semiconductor wafer by way of a grinder to reduce the thickness of the semiconductor wafer to about 100 to 600 µm; and dice cutting the semiconductor wafer following grinding to a predetermined thickness, thereby forming a chip.

According to the production of the semiconductor chip described above, the semiconductor wafer itself has a small thickness, and is fragile. In addition, because of the relief structure of the circuit pattern, the wafer is liable to be damaged when external force is applied during carrying to the grinding step or the dice cutting step. Additionally, in order to remove the polishing dust generated in the polish processing step, or to eliminate the heat generated during polishing, the grinding process is carried out while washing the back face of the semiconductor wafer with purified water. Therefore, it is necessary to prevent the circuit pattern face from being contaminated by the rinse water and the like yielded in the washing. Accordingly, in order to protect the circuit pattern face of the semiconductor wafer, and concurrently to prevent damage of the semiconductor wafer, the grinding operation has been carried out with a tacky adhesion sheet for processing attached onto the circuit pattern face. Moreover, in the dice cutting, a protective sheet is attached on the back face side of the wafer, and the dice cutting is conducted in a state with the wafer being adhered and fixed. The thus obtained chip is picked up by sticking from the film substrate side with a needle, and then fixed on a die pad.

Known exemplary tacky adhesion sheets for high-precision processing include, e.g., those having an adhesive layer formed from an adhesive composition provided on a substrate sheet of polyethylene terephthalate (PET), polyethylene (PE), polypropylene (PP), an ethylene-vinyl acetate copolymer (EVA) or the like (for example, Patent Document 1, Patent Document 2, Patent Document 3).

Furthermore, a constitution in which a protective substrate produced by impregnating a ladder type silicone oligomer into an aluminum nitride-boron nitride sintered compact with pore is used in place of the protective tape, and this protective substrate is adhered to a semiconductor wafer using a thermoplastic film is also disclosed (Patent Document 4). In addition, a constitution in which a material such as alumina, aluminum nitride, boron nitride or silicon carbide having substantially the same coefficient of thermal expansion as that of the semiconductor wafer is used as a protective substrate and using a thermoplastic resin such as polyimide as an adhesive for adhering the protective substrate with the semiconductor wafer, a film having a thickness of 10 to 100 µm is provided by applying this adhesive composition, and a method which includes spin coating of an adhesive composition, and drying to give a film having a thickness of no greater than 20 µm were proposed (Patent Document 5).

Furthermore, in recent years, as multilayer-wiring of semiconductor elements has progressed, a process in which: a protective substrate is adhered using an adhesive composition on the surface of a semiconductor wafer having a circuit formed thereon; the back face of the semiconductor wafer is polished; thereafter, the polished face is etched to give a mirror face; and a circuit on the back face side is formed on this mirror face has put into practice. In this case, the protective substrate is kept adhered until the circuit on the back face side is formed (Patent Document 6).

Patent Document 1: Japanese Unexamined Patent Application, First Publication No. 2003-173993;
Patent Document 2: Japanese Unexamined Patent Application, First Publication No. 2001-279208;
Patent Document 3: Japanese Unexamined Patent Application, First Publication No. 2003-292931;
Patent Document 4: Japanese Unexamined Patent Application, First Publication No. 2002-203821;
Patent Document 5: Japanese Unexamined Patent Application, First Publication No. 2001-77304;
Patent Document 6: Japanese Unexamined Patent Application, First Publication No. S61-158145;

DISCLOSURE OF THE INVENTION

Problems to be Solved by the Invention

The adhesive composition that constitutes the adhesive layer of the protective tape disclosed in Patent Document 1 or Patent Document 2 is not resistant to a high temperature as high as 200° C., and is thus problematic in poor heat resistance. Also, a gas is generated upon heating, leading to inferior adhesion. Moreover, the adhesive composition that constitutes the adhesive layer of the protective tape disclosed in Patent Document 3 is an epoxy resin composition; therefore, there arises a problem of causing peel failure since the epoxy resin is hardened at a high temperature as high as 200° C. to leave residues after the removal.

When alumina, aluminum nitride, boron nitride, silicon carbide or the like is used as the protective substrate (support plate) in place of the protective tape as disclosed in Patent Document 4 or Patent Document 5, automation of handling and carrying is enabled. However, by way of the thermoplastic film used in adhesion between the protective substrate and the semiconductor wafer, degassing due to the moisture absorption cannot be prevented, thereby often leading to adhesion failure.

In addition, not only the grinding of the semiconductor wafer, but the mirror finishing process with an etching liquid and the metal film formation process under a vacuum environment are carried out according to the process disclosed in Patent Document 6; therefore, heat resistance, etching resistance, stripping resistance, and crack resistance are required according to the adhesive composition for adhering the protective substrate and the semiconductor wafer. However, this Patent Document 6 does not disclose any specific detail of the adhesive composition.

Moreover, investigation by the present inventors suggested that an acrylic resin material is preferred as an adhesive composition deemed to be suitable in the aforementioned field, since favorable crack resistance can be achieved. However, even though an adhesive composition including the acrylic material having such an excellent characteristic is used, the following other problems were revealed to occur.

(1) When the adhesive layer and the protective substrate are subjected to thermo compression bonding, the moisture absorbed by at least the adhesive layer generates a gas, resulting in frothy stripping on the boundary surface of adhesion, whereby adhesion failure is caused.

(2) When the process includes the step of allowing the wafer to be in contact with an alkaline slurry or an alkaline liquid such as an alkaline developer, the contact face with the adhesive composition is deteriorated through peeling, dissolution, dispersion and the like by the alkaline liquid.

(3) A substance insoluble in the stripping liquid is formed on the adhesive layer after heating at 200° C. or higher, which may be difficult to remove.

The present invention was made in view of the abovementioned circumstances, and an object thereof is to provide an adhesive composition and an adhesive film which is reduced in gas generation upon heating, has high alkali resistance, has heat resistance of 200° C. or higher, and can be easily removed with a stripping liquid.

Means for Solving the Problems

The adhesive composition according to a first aspect of the present invention includes as a major ingredient, an acrylic polymer produced from (a) styrene, (b) a (meth)acrylic ester monomer containing a cyclic skeleton, and (c) an alkyl (meth) acrylate monomer.

The adhesive composition according to a second aspect of the present invention is characterized in that the (meth)acrylic ester monomer containing a cyclic skeleton (b) includes at least (b1) a (meth)acrylic ester monomer containing a cyclic skeleton having a substituent on the cyclic skeleton, and (b2) a (meth)acrylic ester monomer containing a cyclic skeleton not having a substituent on the cyclic skeleton in the adhesive composition according to the first aspect of the present invention.

The adhesive composition according to a third aspect of the present invention is characterized in that the acrylic polymer has a carboxyl group content of no higher than 1.0 mmol/g in the adhesive composition according to the first or the second aspect of the present invention.

The adhesive composition according to a fourth aspect of the present invention is characterized in that the adhesive composition according to any one of the first to the third aspects of the present invention is an adhesive composition for adhesion of a protective substrate for high-precision processing of a semiconductor wafer used for adhering a protective substrate for high-precision processing of the semiconductor wafer to the semiconductor wafer.

The adhesive composition according to a fifth aspect of the present invention is characterized in that a stripping liquid used for removing the protective substrate from the semiconductor wafer has a solubility parameter (SP value) that is approximate to the SP value of the acrylic polymer in the adhesive composition according to the fourth aspect of the present invention.

The adhesive film according to a sixth aspect of the present invention is characterized by including an adhesive composition layer formed from at least the adhesive composition according to any one of the first to the fifth aspects of the present invention on a support film.

In order to solve the foregoing problems, the adhesive composition according to the present invention is characterized by including as a major ingredient, an acrylic polymer produced from (a) styrene, (b) a (meth)acrylic ester monomer containing a cyclic skeleton, and (c) an alkyl (meth)acrylate monomer.

According to the composition of the present invention, heat resistance (not deteriorated even at 200° C.) can be improved by blending the aforementioned styrene (a). It is preferred that the amount of the blended styrene (a) be 30 to 90 parts by mass per 100 parts by mass in total of the styrene (a), the (meth)acrylic ester monomer containing a cyclic skeleton (b), and the alkyl (meth)acrylate monomer (c). Blending in an amount of no less than 30 parts by mass can achieve efficacious heat resistance, while blending in an amount of no more than 90 parts by mass can lead to inhibition of decrease in the crack resistance.

By blending the (meth)acrylic ester monomer containing a cyclic skeleton (b), heat resistance can be improved, and the amount of acrylic acid needed in the polymer can be reduced, whereby attaining favorable stripping property by the stripping liquid can be realized. Although commonly employed stripping liquid can be used as the stripping liquid, a stripping liquid containing PGMEA (propylene glycol monomethyl ether acetate), ethyl acetate, or methyl ethyl ketone as a major ingredient is particularly preferred in light of the environmental burden and stripping properties. Furthermore, heat resistance can be improved also by blending this (meth)acrylic ester monomer containing a cyclic skeleton (b). It is preferred that the amount of the blended (meth)acrylic ester monomer containing a cyclic skeleton (b) be 5 to 60 parts by mass per 100 parts by mass in total of the styrene (a), the (meth)acrylic ester monomer containing a cyclic skeleton (b), and the alkyl (meth)acrylate monomer (c). Blending in an amount of no less than 5 parts by mass can achieve efficacious heat resistance, while blending in an amount of no more than 60 parts by mass can lead to inhibition of deterioration of the stripping property.

By blending the alkyl (meth)acrylate monomer (c), flexibility and crack resistance of the adhesive layer can be attained. It is preferred that the amount of the blended alkyl (meth)acrylate monomer (c) be 10 to 60 parts by mass per 100 parts by mass in total of the styrene (a), the (meth)acrylic ester monomer containing a cyclic skeleton (b), and the alkyl (meth)acrylate monomer (c). Efficacious flexibility and crack resistance can be achieved by blending no less than 10 parts by mass, while hygroscopicity and reduction of heat resistance as well as peel failure can be inhibited by blending no more than 60 parts by mass.

The (meth)acrylic ester monomer containing a cyclic skeleton is a monomer unit derived from a (meth)acrylic ester, and has a structure in which a hydrogen atom in the carboxyl group is substituted with a cyclic group or an alkyl group having a cyclic group. Alternatively, the (meth)acrylic ester monomer containing a cyclic skeleton is a monomer unit derived from a (meth)acrylic ester, and has a structure in which a hydrogen atom in the carboxyl group is substituted with an alkylol group, and further a hydrogen atom in the alkylol group is substituted with a cyclic group.

Illustrative examples of the cyclic group include monocyclic groups or polycyclic groups having an aromatic property such as groups derived from benzene, naphthalene, anthracene and the like by eliminating one or more hydrogen atom(s), as well as the following aliphatic cyclic groups. The cyclic group may or may not have a substituent on the cyclic skeleton thereof.

Specific examples of such aliphatic cyclic groups include groups derived from monocycloalkane, polycycloalkane such as dicycloalkane, tricycloalkane, tetracycloalkane and the like by eliminating one or more hydrogen atom(s). More specifically, groups derived from monocycloalkane such as cyclopentane and cyclohexane, and polycycloalkane such as adamantane, norbornane, isobornane, tricyclodecane and tetracyclododecane by eliminating one or more hydrogen atom(s) can be exemplified. In particular, groups derived from cyclohexane or dicyclopentane by eliminating one or more hydrogen atom(s) are preferred, which may further have a substituent.

When the cyclic group has a substituent on the cyclic skeleton thereof, examples of the substituent include polar groups such as a hydroxyl group, a carboxyl group, a cyano group and an oxygen atom (=O), and linear or branched lower alkyl groups having 1 to 4 carbon atoms. When the cyclic group has a substituent on the cyclic skeleton, the substituent is preferably the polar group and/or the lower alkyl group. As the polar group, an oxygen atom (=O) is particularly preferred.

As the alkyl group having a cyclic group, an alkyl group having 1 to 12 carbon atoms and having the cyclic group described above is preferred. Examples of the (meth)acrylic ester monomer containing a cyclic skeleton include cyclohexyl-2-propylacrylate, and the like.

As the alkylol group, an alkylol group having 1 to 4 carbon atoms is preferred. Examples of such a (meth)acrylic ester monomer containing a cyclic skeleton include phenoxyethyl acrylate, phenoxypropyl acrylate, and the like.

The term "aliphatic" referred to in claims and specification of the present application is defined to mean a relative concept contrary to "aromatic", and involves groups, compounds and the like not having an aromatic property. The term "aliphatic cyclic group" indicates a monocyclic group or a polycyclic group not having an aromatic property. The base ring structure of the "aliphatic cyclic group" except for the substituent is not limited to a group consisting of carbon atoms and hydrogen atoms (i.e., hydrocarbon group), but is preferably a hydrocarbon group. Also, the "hydrocarbon group" may be either saturated or unsaturated, but is preferably saturated, in general. Furthermore, a polycyclic group is preferred.

In the adhesive composition of the present invention, (b) an ingredient including at least (b1) a (meth)acrylic ester monomer containing a cyclic skeleton having a substituent on the cyclic skeleton, and (b2) a (meth)acrylic ester monomer containing a cyclic skeleton not having a substituent on the cyclic skeleton can be used as the (meth)acrylic ester monomer containing a cyclic skeleton (b). By concurrently including the ingredient (b1) and the ingredient (b2) as the ingredient (b), maintenance of the heat resistance, and improvement of flexibility can be both achieved more easily.

The alkyl (meth)acrylate monomer (c) means acrylic long chain alkyl esters in which the alkyl group has 15 to 20 carbon atoms, and acrylic alkyl esters in which the alkyl group has 1 to 14 carbon atoms.

Examples of the acrylic long chain alkyl esters in which the alkyl group has 15 to 20 carbon atoms can include long chain alkyl esters of acrylic acid or methacrylic acid, in which the alkyl group is a n-pentadecyl group, n-hexadecyl group, n-heptadecyl group, n-octadecyl group, n-nonadecyl group, or n-eicosyl group. Also, the long chain alkyl group may be branched.

As the acrylic alkyl esters in which the alkyl group has 1 to 14 carbon atoms, known ones which have been used in conventional acrylic adhesives can be exemplified. Typical examples thereof include alkyl esters of acrylic acid or methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, or a tridecyl group.

In the adhesive composition of the present invention, when the acrylic polymer produced from the aforementioned ingredients (a), (b), and (c) is obtained, it is desired that the carboxyl group content in the polymer be no greater than 1.0 mmol/g. When the carboxyl group content is no greater than 1.0 mmol/g, hygroscopicity can be lowered, whereby reduction in tacky adhesiveness due to a pseudo-crosslinking effect that is deemed to result from hydrogen bonds formed between carboxyl groups can be inhibited. In addition, it was ascertained that alkali resistance is improved by keeping the carboxyl group content at a low value. Therefore, since deterioration of the adhesive layer is less likely to occur even though it is in contact with an alkaline liquid, the degree of freedom of applicable range can be enlarged.

In the adhesive composition of the present invention, the acrylic polymer has a molecular weight of preferably 5,000 to 500,000, and more preferably 10,000 to 100,000. When the molecular weight falls within this range, flexibility and crack resistance of the formed adhesive layer can be further efficacious.

In the adhesive composition of the present invention, acrylamide such as dimethyl acrylamide, and morpholine such as acryloylmorpholine may be blended as other additives. By blending these compounds, concurrent improvement of the heat resistance and adhesiveness can be expected.

To the adhesive composition of the present invention can be further added as desired, miscible additives such as, e.g., an additional resin for improving the adhesive performances, a plasticizer, an adhesion aid, a stabilizer, a colorant, a surfactant and the like, which are commonly used, to be included in the range not to deteriorate essential features.

Furthermore, an organic solvent can be appropriately blended in the adhesive composition of the present invention for adjusting the viscosity. Specific examples of such organic solvent include: ketones such as acetone, methyl ethyl ketone, cyclohexanone, methyl isoamyl ketone, and 2-heptanone; polyvalent alcohols and derivatives thereof, such as ethylene glycol, ethylene glycol monoacetate, diethylene glycol, diethylene glycol monoacetate, propylene glycol, propylene glycol monoacetate, dipropylene glycol or dipropylene glycol monoacetate, or monomethyl ether, monoethyl ether, monopropyl ether, monobutyl ether or monophenyl ether thereof; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropanoate. These may be used alone, or in any combinations of two or more thereof. Particularly, polyvalent alcohols and derivatives thereof such as ethylene glycol, propylene glycol, diethylene glycol, ethylene glycol monoacetate, propylene glycol monoacetate, diethylene glycol monoacetate, or monomethyl ether, monoethyl ether, monopropyl ether, monobutyl ether or monophenyl ether thereof are preferred. Also, an active agent may be added thereto for improving uniformity of the film thickness.

The adhesive composition of the present invention realizes an excellent effect by, in particular, using as an adhesive composition for adhesion of a protective substrate for high-precision processing of semiconductor wafers, which is for use in adhering a protective substrate for high-precision processing of semiconductor wafers to a semiconductor wafer. On the other hand, however, it can be also used as a tacky adhesion layer of a protective tape, and excellent characteristics can be exerted also in such a case.

According to the adhesive composition of the present invention, required heat resistance and stripping properties can be attained by selecting the stripping liquid to modify the composition. More specifically, because the stripping liquid used for removing the protective substrate from the semiconductor wafer has a solubility parameter (SP value) that is approximate to the SP value of the acrylic polymer, more excellent stripping properties can be attained. The SP value referred to herein is a known parameter which is derived by raising the cohesive energy density (evaporation energy of one molecule per unit area) to the ½-th power, and represents the degree of polarity per unit volume. The SP value of the acrylic polymer as the adhesive composition of the present invention is preferably 8.8 to 9.3 $(cal/cm^3)^{1/2}$, and more preferably 8.9 to 9.2 $(cal/cm^3)^{1/2}$. The stripping liquid for the adhesive composition in this scope is particularly preferably PGMEA (SP value: 9.2) in light of the environmental burden, and stripping properties.

Although the SP value can be measured by a known method as described in, for example, Japanese Patent No. 3688702, it can be also estimated by a variety of known estimation method such as one reported by Hildebrand, Small, Foy, Hansen, Krevelen, Fedors, Hoftyzer. In many of such cases, the SP value of the acrylic polymer is represented by the weighted average of the SP value of the constituting monomer.

Since there is not a (meth)acrylic acid monomer in the resin constitution of the present invention, the carboxyl group content can be kept at no greater than 1.0 mmol/g. Thus, the SP value can be controlled, thereby capable of attaining favorable match to meet the stripping liquid.

The adhesive composition of the present invention as described in the foregoing can be used in any method of: a method in which the composition is applied directly in the form of a liquid on the material to be processed thereby forming an adhesive composition layer, or a method in which the adhesive composition layer is formed and dried on a flexible film beforehand, and this film (dry film) is used after attaching to the material to be processed (adhesive film method), deepening on the application.

Next, the adhesive film of the present invention is described below. The adhesive film of the present invention is obtained by providing at least the adhesive composition layer of the present invention on a support film. In use of the adhesive film, when the adhesive composition layer is further covered thereon by a protective film, the adhesive composition layer can be easily provided on the material to be processed by peeling the protective film from the adhesive composition layer and overlaying the exposed adhesive composition layer on the material to be processed, and subsequently peeling the support film from the adhesive composition layer.

Use of the adhesive film of the present invention enables formation of a layer having more excellent film thickness uniformity and surface smoothness, as compared with the case of forming the adhesive composition layer by directly applying the adhesive composition on the material to be processed.

The support film used for producing the adhesive film of the present invention is not particularly limited, and any one can be used as long as the adhesive composition layer formed as a film on the support film can be peeled easily from the support film, and it is a mould releasing film that enables transfer of each layer onto the surface to be processed of the protective substrate, wafer and the like. Examples of such a support film include flexible films composed of a film of a synthetic resin such as polyethylene terephthalate, polyethylene, polypropylene, polycarbonate or polyvinyl chloride with a film thickness of 15 to 125 μm. It is preferable that the above support film be subjected to a mould releasing treatment if necessary so as to facilitate the transfer.

When the adhesive composition layer is formed on the support film, the adhesive composition of the present invention is prepared, and is applied on the support film such that the dried film thickness is 10 to 1000 μm using an applicator, a bar coater, a wire bar coater, a roll coater, a curtain flow coater or the like. In particular, the roll coater is preferable because a film that is thick and has excellent film thickness uniformity can be formed efficiently.

As the protection film, a polyethylene terephthalate film, a polypropylene film or a polyethylene film with a thickness of about 15 to 125 μm to which silicone has been applied or burned in is suitable.

Next, the method of using the adhesive film of the present invention is described below. First, the protective film is peeled from the adhesive film, and then the adhesive composition layer is bonded by thermo compression on the surface of the material to be processed by lapping the exposed adhesive composition layer over the material to be processed and moving a heating roller on and over the support film. The protective film peeled from the adhesive film can be reused if rolled up by a sequential take-up roller and stored.

Although the adhesive composition of the present invention is used in applications of adhesion as an adhesive composition, and is not particularly limited, it can be suitably used as an adhesive composition for adhesion of a protective substrate for high-precision processing of semiconductor wafers, for use in adhering the protective substrate for high-precision processing of semiconductor wafers to a substrate such as semiconductor wafers. The adhesive composition of the present invention can be suitably used in the method of attaching a substrate described in Japanese Unexamined Patent Application, First Publication No. 2005-191550.

Next, the method of attaching a substrate using the adhesive composition of the present invention is described below. In detail, this method includes, prior to the step of grinding a substrate such as a semiconductor wafer to give a thin plate, attaching the circuit-formed surface of the substrate to a protective substrate (support plate). According to this method, cracking and chipping of the substrate is likely to be generated when the thickness of the substrate such as a semiconductor wafer is reduced. After applying the adhesive composition on the semiconductor wafer surface having a circuit (element) formed thereon, the fluidity of this adhesive composition is reduced by preliminary drying, whereby the adhesive composition layer is formed. The temperature in the preliminary drying step is preferably 200° C. or lower. The preliminary drying is carried out by, for example, heating at 80° C. for 5 min using an oven. The thickness of the adhesive composition layer is determined depending on the relief structure of the circuit formed on the surface of the semiconductor wafer. In order to increase the thickness of the adhesive composition layer, application and the preliminary drying of the adhesive composition may be repeated more than once. Thereafter, the protective substrate is attached to the semiconductor wafer provided with the adhesive composition layer formed to have a predetermined thickness. When the adhesive composition is applied onto the circuit-formed surface of the substrate such as a semiconductor wafer by a spin coater, a raised part referred to as a bead portion is often formed on the periphery. In this instance, the bead portion can be removed with a solvent before the preliminary drying of the adhesive composition. By thus carrying out the preliminary drying, the film thickness of the adhesive composition layer can be readily controlled.

The protective substrate is pressed against the adhesive layer to integrate therewith, and the adhesive layer is dried concomitant with or after completing the pressing. The temperature in this drying step is preferably 300° C. or lower.

When the protective substrate is bonded by thermo compression to the adhesive layer, a number of through holes may be provided in the thickness direction in order to avoid remaining of bubble between the protective substrate and the adhesive layer, or for the purpose of injecting the stripping liquid between the adhesive layer and the protective substrate upon the peeling. In such a process, the preliminary drying preferably accomplishes drying until the adhesive does not exude from the through hole when the pressing is carried out.

According to the adhesive composition of the present invention, the temperature in the preliminary drying step can be 200° C. or lower (40 to 200° C.), while the temperature in the drying step can be 300° C. or lower (40 to 300° C.).

As the stripping liquid for removing the adhesive composition, in addition to the solvent for use in the adhesive composition: monovalent alcohols such as methanol, ethanol, propanol, isopropanol, or butanol; cyclic lactones such as γ-butyrolactone; ethers such as diethyl ether or anisole; dimethylformaldehyde, dimethylacetaldehyde or the like may be used. In particular, a stripping liquid including propylene glycol monomethyl ether acetate, or ethyl lactate as a major ingredient is preferable in light of the environmental burden and stripping properties.

Effects of the Invention

As described in the foregoing, the adhesive composition according to the present invention is accompanied by reduced gas generation upon heating (has low hygroscopicity), has high alkali resistance, has heat resistance of 200° C. or higher, and can be easily removed with a stripping liquid. Moreover, excellent protective characteristics, and holding characteristics can be exhibited for the material to be processed even though the composition is used as a tacky adhesion layer of a protective sheet, not alone as a protective substrate.

PREFERRED MODE FOR CARRYING OUT THE INVENTION

Figure 1:
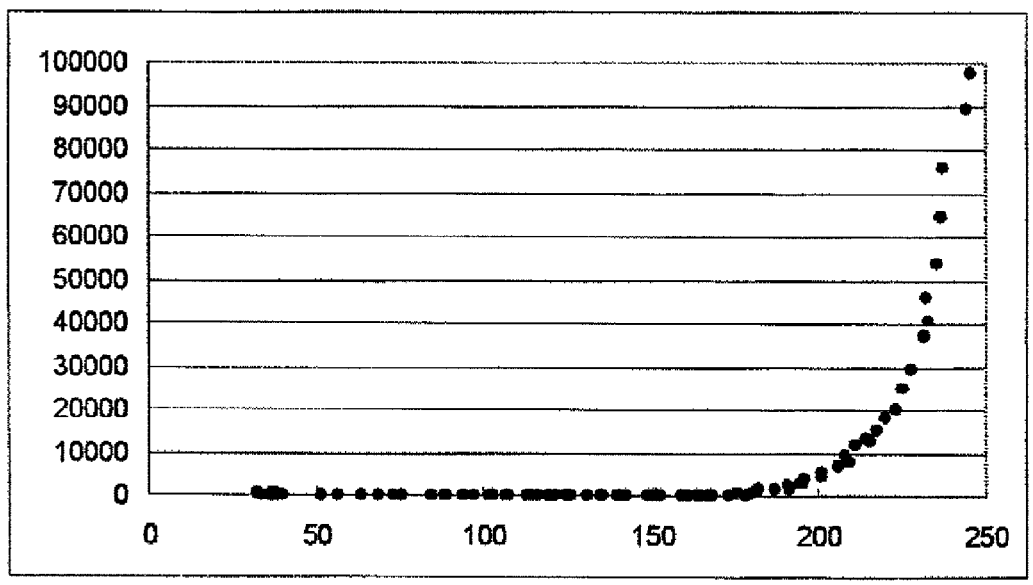
FIG. 1 shows a graphic representation of results of measuring TDS of the coating film in Example.

Examples of the adhesive composition according to the present invention are described below. The examples presented below are merely an illustration for appropriately demonstrating the present invention; and the present invention is not any how limited thereto.

EXAMPLES

Examples 1 to 11

A flask equipped with a stirrer, a refluxer, a thermometer, and a driptank was substituted with nitrogen gas, and thereafter the flask was charged with 100 parts by mass of propylene glycol methyl ether acetate (PGMEA) as a solvent, and then stirring was started. Thereafter, the temperature of the solvent was elevated to 80° C. Next, the driptank was charged with various types of monomers shown in Tables 1 and 2 below at a blending ratio (parts by mass) shown in Tables 1 and 2, respectively, and the mixture was stirred until all ingredients were dissolved. Subsequently, this solution was uniformly dripped into the flask over 3 hrs, then polymerization was successively performed at 80° C. for 5 hrs. The reaction solution was then cooled to room temperature to obtain an acrylic polymer of the present invention.

TABLE 1

| Example | 1 | 2 | 3 | 4 | 5 | 6 | 7 | 8 |
|---|---|---|---|---|---|---|---|---|
| (c1) methyl methacrylate | 25 | | | 15 | 15 | 20 | 15 | 15 |
| (c2) n-butyl methacrylate | | 30 | | 15 | 15 | 15 | 15 | 15 |
| (c3) ethyl acrylate | | | 35 | | | | | |
| (a) styrene | 55 | 50 | 45 | 55 | 50 | 55 | 50 | 45 |
| (b1) isobornyl methacrylate | 20 | | | | | 10 | 10 | 15 |
| (b2) dicyclopentanyl methacrylate | | 20 | | | | | 10 | 10 |
| (b3) cyclohexyl methacrylate | | | 20 | | | | | |
| (b4) ethylcyclohexyl methacrylate | | | | 20 | | | | |
| (b5) phenoxyethyl acrylate | | | | | 20 | | | |

Comparative Examples 1 to 2

A flask equipped with a stirrer, a refluxer, a thermometer, and a driptank was substituted with nitrogen gas, and thereafter the flask was charged with 100 parts by mass of propylene glycol methyl ether acetate (PGMEA) as a solvent, and then stirring was started. Thereafter, the temperature of the solvent was elevated to 80° C. Next, the driptank was charged with various types of monomers shown in Table 2 below at a blending ratio (parts by mass) shown in Table 2, respectively, and the mixture was stirred until all ingredients were dissolved. Subsequently, this solution was uniformly dripped into the flask over 3 hrs, then polymerization was successively performed at 80° C. for 5 hrs. The reaction solution was then cooled to room temperature to obtain an acrylic polymer of the present invention.

TABLE 2

| | Example and Comparative Example | | | | |
|---|---|---|---|---|---|
| | 9 | 10 | 11 | 1 | 2 |
| (c1) methyl methacrylate | 30 | | 6 | 10 | |
| (c2) n-butyl methacrylate | 30 | 15 | | | 20 |
| (a) styrene | 25 | 25 | 90 | 45 | 30 |
| (b1) isobornyl methacrylate | 15 | 30 | 4 | 15 | |
| (b2) dicyclopentanyl methacrylate | | 30 | | | 10 |
| (b3) cyclohexyl methacrylate | | | | | 10 |
| (d1) methacrylic acid | | | | 30 | |
| (d2) 2-hydroxyethyl acrylate | | | | | 30 |

Evaluation

Each acrylic polymer (adhesive composition) of each of the above Examples 1 to 11 and Comparative Examples 1 to 2 was evaluated on the following characteristics.

Application Property

The adhesive composition was applied on a 6-inch silicon wafer using a spinner at 1000 rpm for 25 sec, and the wafer was heated under four types of heating conditions on a hot plate. In these four types of heat conditions, heating temperatures were 110° C., 150° C. and 200° C., and heating time period was 3 min. The film thickness was 15 μm. Thus formed film face was visually observed, and application property was evaluated in accordance with the following evaluation standard.

○: The obtained coating film exhibited no unevenness, and was uniform.

x: The obtained coating film exhibited unevenness such as pinhole and repelling.

Flexibility

The presence or absence of crack on the dry coating film was visually observed, and the evaluation was made in accordance with the presence or the absence of crack on two kinds of the samples having a film thickness of 15 μm and 20 μm. The presence of crack in both cases was graded x; the presence in the case of 15 μm-film thickness while the absence in the case of 20 μm-thickness was graded Δ; and the absence in both cases was graded ○.

Heat Resistance, and Hygroscopicity

Each adhesive composition of the Examples and Comparative Examples was applied on a silicon wafer, and the temperature of the coating film was elevated from lower than 50° C. up to 250° C. The amount of degassing from the film was measured, and the evaluation was made according to the amount of degassing. For the measurement, a TDS method (Thermal Desorption Spectroscopy method; temperature-programmed desorption analysis method) was employed. EMD-WA1000 manufactured by ESCO, Ltd. was used as the apparatus for determination of TDS (thermal desorption spectrometer; emitted gas measurement device). The evaluation of the heat resistance was made to grade: ○, when the intensity at a position with a temperature of 200° C. was no greater than 10000, and the residue was not observed by a metal microscope: Δ, when the residue was not observed by a metal microscope although the intensity was no less than 10000; and x, when the intensity was no less than 10000, and the residue was observed by a metal microscope. With respect to the evaluation on hygroscopicity, it was graded: ○, when the intensity at a point with a temperature of 100° C. was no greater than 10000; and x, when the intensity was no less than 10000. In formation of a through electrode or the like, the adhesive is kept in a high-temperature environment; therefore, high hygroscopicity results in vaporization of the moisture, whereby adhesion failure may be caused.

Conditions of the measurement by way of the TD spectrometer were as in the following.

Width: 100

Center Mass Number: 50

Gain: 9

Scan Speed: 4

Emult Volt: 1.3 KV

Measurement temperature: 40° C. to 250° C.

Figure 2:
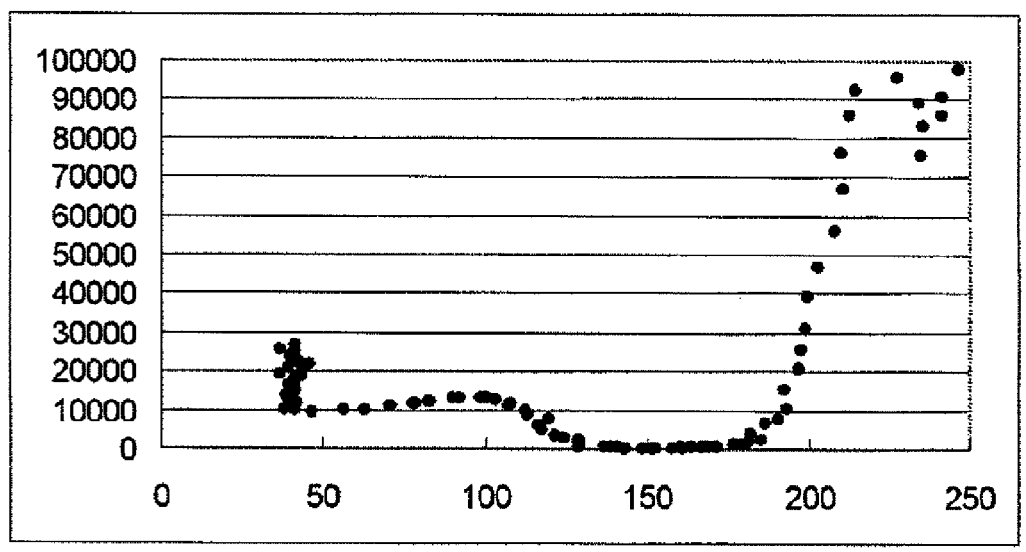
FIG. 2 shows a graphic representation of results of measuring TDS of the coating film in Comparative Example.

In the measurement by way of the TD spectrometer, the coating film was fed into the measuring chamber, and the measurement was initiated one minute later. Graphic representations of the results of measuring TDS are shown in FIG. 1 (Example 1) and FIG. 2 (Comparative Example 1). Examples 2 to 11 also gave the results representing a shape of the graph similar to that shown in FIG. 1 in the range of 0 to 200° C. In the graph, the elevated (measurement) temperature is indicated along the abscissa, while the arbitrary intensity is indicated along the ordinate. Emult Volt in the measurement conditions is an abbreviation of "Electron Multiplyer Acceleration Voltage", which is generally denoted as Q-mass (quadruple mass spectrometer) accelerating voltage.

Evaluation of heat resistance and hygroscopicity is enabled by this graphic representation on the grounds as in the following. Specifically, since the emitted gas at 100° C. or lower shall be water vapor or an azeotropic gas thereof, low value at this temperature leads to an evaluation that the moisture was not absorbed. Whereas, the emitted gas at a temperature of 100° C. or higher is any gas other than water vapor or the azeotropic gas thereof, i.e., almost a gas generated from the resin; therefore, less generation of such a gas can lead to an evaluation that less thermal degradation was caused. In particular, lower amount of the emitted gas at around 200° C. (approximate to a temperature of rising) leads to an evaluation that greater resistance to thermal degradation was suggested.

Stripping Property

The SP value of the acrylic polymer used in the adhesive composition was estimated according to a Trouton's rule, and Hildebrand's formula. The SP value is derived by raising the cohesive energy density, i.e., evaporation energy of one molecule per unit volume, to the ½-th power, and represents the degree of polarity per unit volume.

The results of evaluation with respect to the aforementioned evaluation items are presented in the following Table 3 (Examples) and Table 4 (Examples and Comparative Examples).

TABLE 3

| Example | 1 | 2 | 3 | 4 | 5 | 6 | 7 | 8 |
|---|---|---|---|---|---|---|---|---|
| Application property | ○ | ○ | ○ | ○ | ○ | ○ | ○ | ○ |
| Flexibility | ○ | ○ | ○ | ○ | ○ | ○ | ○ | ○ |
| Heat resistance | ○ | ○ | ○ | ○ | ○ | ○ | ○ | ○ |
| Hygroscopicity | ○ | ○ | ○ | ○ | ○ | ○ | ○ | ○ |
| Stripping property (SP value) | 9.0 | 9.0 | 9.1 | 9.0 | 9.1 | 9.0 | 9.0 | 8.9 |

TABLE 4

| | Example and Comparative Example | | | | |
|---|---|---|---|---|---|
| | 9 | 10 | 11 | 1 | 2 |
| Application property | ○ | ○ | ○ | ○ | ○ |
| Flexibility | ○ | ○ | Δ | ○ | ○ |
| Heat resistance | Δ | Δ | ○ | x | x |
| Hygroscopicity | ○ | ○ | ○ | x | x |
| Stripping property (SP value) | 8.9 | 8.6 | 9.2 | 9.7 | 9.5 |

Industrial Applicability

As described hereinabove, the adhesive composition and the adhesive film according to the present invention are accompanied by reduced gas generation upon heating (has low hygroscopicity), has high alkali resistance, has heat resistance of 200° C. or higher, and can be easily removed with a stripping liquid. Moreover, excellent protective characteristics and holding characteristics can be exhibited for the material to be processed even though they are used as a tacky adhesion layer of a protective sheet, not alone as a protective substrate.

The invention claimed is:

1. An adhesive composition comprising a polymer as an adhesive ingredient, said polymer produced from monomers consisting essentially of:
   (a) styrene;
   (b) a (meth)acrylic ester monomer containing a cyclic skeleton; and
   (c) an alkyl (meth)acrylate monomer,
   wherein the polymer has a carboxyl group content of no higher than 1.0 mmol per gram of the polymer, and wherein the (meth)acrylic ester monomer containing a cyclic skeleton (b) comprises at least (b1) a (meth)acrylic ester monomer containing a cyclic skeleton having a substituent on the cyclic skeleton, wherein the substituent is selected from the group consisting of a polar group, a linear lower alkyl group having 1 to 4 carbon atoms, and a branched lower alkyl group having 1 to 4 carbon atoms, and (b2) a (meth)acrylic ester monomer containing a cyclic skeleton not having the substituent on the cyclic skeleton,
   and wherein the styrene (a) is blended in an amount of 30 to 90 parts by mass, the (meth)acrylic ester monomer containing a cyclic skeleton (b) is blended in an amount of 5 to 60 parts by mass, and the alkyl (meth)acrylate monomer (c) is blended in an amount of 10 to 60 parts by mass, wherein the sum of the parts by mass of the styrene (a), the (meth)acrylic ester monomer containing a cyclic skeleton (b) and the alkyl (meth)acrylate monomer (c) is 100.

2. The adhesive composition according to claim 1, which is used for adhering a protective substrate to a semiconductor for high-precision processing thereof.

3. An adhesive film comprising an adhesive composition layer formed from at least the adhesive composition according to claim 1 on a support film.

4. The adhesive composition according to claim 1, wherein the polymer has a solubility parameter (SP value) of 8.8 to 9.3 $(\text{cal/cm}^3)^{1/2}$.

5. The adhesive composition according to claim 1, wherein the polymer has an SP value of 8.9 to 9.2 $(\text{cal/cm}^3)^{1/2}$.

6. The adhesive composition according to claim 1, wherein the substituent on the cyclic skeleton is a substituent containing an oxygen atom as a polar group, or a lower alkyl group having 1 to 4 carbon atoms.

7. The adhesive composition according to claim 1, wherein the polar group is selected from the group consisting of a hydroxyl group, a carboxyl group, a cyano group and an oxygen atom (=O).

* * * * *